(12) United States Patent
Prineas et al.

(10) Patent No.: US 11,222,993 B2
(45) Date of Patent: Jan. 11, 2022

(54) CASCADED BROADBAND EMISSION

(71) Applicant: UNIVERSITY OF IOWA RESEARCH FOUNDATION, Iowa City, IA (US)

(72) Inventors: John P. Prineas, Iowa City, IA (US); Dennis Norton, Iowa City, IA (US); Thomas F. Boggess, Iowa City, IA (US); Russell J. Ricker, Coralville, IA (US)

(73) Assignee: UNIVERSITY OF IOWA RESEARCH FOUNDATION, Iowa City, IA (US)

( * ) Notice: Subject to any disclaimer, the term of this patent is extended or adjusted under 35 U.S.C. 154(b) by 0 days.

(21) Appl. No.: 16/489,013

(22) PCT Filed: Feb. 28, 2018

(86) PCT No.: PCT/US2018/020296
§ 371 (c)(1),
(2) Date: Aug. 27, 2019

(87) PCT Pub. No.: WO2018/160746
PCT Pub. Date: Sep. 7, 2018

(65) Prior Publication Data
US 2020/0006592 A1  Jan. 2, 2020

Related U.S. Application Data

(60) Provisional application No. 62/464,766, filed on Feb. 28, 2017.

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0062* (2013.01); *H01L 33/08* (2013.01);
(Continued)

(58) Field of Classification Search
None
See application file for complete search history.

(56) References Cited

U.S. PATENT DOCUMENTS 5,166,761 A    11/1992  Olson et al.
7,692,202 B2*  4/2010   Bensch ................... H01L 31/11
                                                    257/96
(Continued)

OTHER PUBLICATIONS

International Search Report & Written Opinion dated May 30, 2018 in corresponding International Application No. PCT/US2018/020296.
(Continued)

*Primary Examiner* — Dung A. Le
(74) *Attorney, Agent, or Firm* — Miles & Stockbridge P.C.; Ajay A. Jagtiani

(57) ABSTRACT

Methods and a device for cascading broadband emission are described. An example device can comprise a substrate, a bottom contact layer above at least a portion of the substrate, and a plurality of emission regions above the bottom contact layer. The plurality of emission regions can be disposed one above another. Each of the plurality of emission regions can be configured with different respective band gaps to emit radiation of different wavelengths. The device can comprise a plurality of tunnel junctions. Each of the tunnel junctions can be disposed between at least two corresponding emission regions of the plurality of emission regions. The device can comprise a top contact layer above the plurality of emission regions.

16 Claims, 8 Drawing Sheets

(51) Int. Cl.
*H01L 33/08* (2010.01)
*H01L 33/14* (2010.01)
*H01L 33/30* (2010.01)
*H01L 33/36* (2010.01)

(52) U.S. Cl.
CPC .............. *H01L 33/14* (2013.01); *H01L 33/30* (2013.01); *H01L 33/36* (2013.01); *H01L 2933/0016* (2013.01)

(56) References Cited

U.S. PATENT DOCUMENTS

| | | | |
|---|---|---|---|
| 8,022,388 B2 | 9/2011 | Brandes | |
| 8,058,663 B2* | 11/2011 | Fan | H01L 27/15 257/98 |
| 10,461,505 B2* | 10/2019 | Chen | H01S 5/3095 |
| 2015/0263218 A1* | 9/2015 | Miller | H01L 24/05 438/27 |
| 2017/0018679 A1* | 1/2017 | Lee | H01L 33/06 |
| 2018/0006187 A1* | 1/2018 | Liu | H01L 33/025 |

OTHER PUBLICATIONS

Koerperick, E.J., et al., "Active Region Cascading for Improved Performance in InAs—GaSb Superlattice LEDs." IEEE Journal of Quantum Electronics, vol. 44, No. 12, Dec. 2008 (Dec. 2008), abstract; Fig 1; p. 1243 [online] [retrieved on May 3, 2018] <URL: https://www.researchgate.neVpublication/224349061>.

Murray, L.M., et al., "Comparison of tunnel junctions for cascaded InAs/GaSb superlattice light emitting diodes." J. Vac. Sci. Technol. B 30, 021203 Mar. 7, 2012 (Mar. 7, 2012), abstract [online][retrieved on May 3, 2018] <URL: http:l/dx.doi.org/10.1116/1.3692252>.

Ricker, R.J., et al., "Broadband mid-infrared superlattice light-emitting diodes." Journal of Applied Physics, vol. 121, Issue 18, id. 185701, abstract, May 2017 (May 2017), abstract [online][retrieved on May 3, 2018] <URL: http://adsabs.harvard.edu/abs/2017 JAP ... 121 r5701 R>.

* cited by examiner

CASCADED BROADBAND EMISSION

CROSS-REFERENCE TO RELATED APPLICATION

This application claims priority to U.S. Provisional Patent Application 62/464,766 filed Feb. 28, 2017, which is hereby incorporated by reference in its entirety.

This invention was made with government support under FA865114M0272 awarded by the Department of the Air Force. The government has certain rights in the invention.

BACKGROUND

Molecular vibrational and rotation modes provide an optical absorption fingerprint in the infrared band that are of particular interest for optical sensing technologies. Chemical identification through absorption spectra via Fourier Transform Infrared (FTIR) spectrometry is a ubiquitous method, and imaging in the infrared has distinct advantages over the visible, most notably in dark or low-visibility situations. For generalized applications, broadband sources are important. Because of the utility of infrared light, infrared sources for illumination and spectroscopy need to be developed. These and other shortcomings are addressed by the approaches set forth herein.

SUMMARY

It is to be understood that both the following general description and the following detailed description are exemplary and explanatory only and are not restrictive. Methods and a device for cascading broadband emission are described. An example device can comprise a substrate, a bottom contact layer above at least a portion of the substrate, and a plurality of emission regions above the bottom contact layer. The plurality of emission regions can be disposed one above another. Each of the plurality of emission regions can be configured with different respective band gaps to emit radiation of different wavelengths. The device can comprise a plurality of tunnel junctions. Each of the tunnel junctions can be disposed between at least two corresponding emission regions of the plurality of emission regions. The device can comprise a top contact layer above the plurality of emission regions.

In another aspect, an example method of fabrication can comprise forming a first contact layer on a substrate and forming a plurality of emission regions. The plurality of emission regions can be disposed one above another. The plurality of emission regions can be separated by a plurality of corresponding tunnel junctions. Each of the plurality of emission regions can be configured with different respective band gaps to emit radiation of different wavelengths. The method can comprise forming a second contact layer above the plurality of emission regions.

In another aspect, an example method of operation a device can comprise receiving a current at a first contact layer and providing the current to a plurality of emission regions disposed one above another and separated by a plurality of corresponding tunnel junctions. Each of the plurality of emission regions can be configured with different respective band gaps. The method can comprise emitting electromagnetic radiation having a spectrum range from the plurality of emission regions. Each of the plurality of emission regions can emit a respective portion of the spectrum range based on the respective band gap of the emission region.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1:
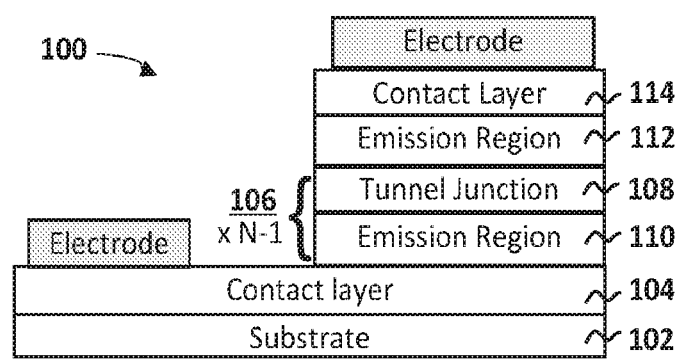
FIG. 1 is a diagram illustrating an example device in accordance with the present methods and systems.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

The present disclosure relates to methods for increasing the emission bandwidth of an LED multiple times. The present disclosure has applications in Infrared optical sensing and monitoring (e.g., gases, biomolecules, plastic, etc.), infrared spectroscopy, as we as other fields.

Molecular vibrational and rotation modes provide an optical absorption fingerprint in the infrared band that are of particular interest for optical sensing technologies. Chemical identification through absorption spectra via Fourier Transform Infrared (FTIR) spectrometry is a ubiquitous method, and imaging in the infrared has distinct advantages over the visible, most notably in dark or low-visibility situations. For generalized applications, broadband sources are important. Because of the utility of infrared light, infrared sources for illumination and spectroscopy need to be developed. The most common infrared sources are thermal, providing blackbody radiation with spectra in accordance with Planck's law, but the maximum radiances are constrained by maximum temperature materials can handle without thermal degradation, i.e. in sublimation and oxidation.

Light emitting diodes (LEDs) are semiconductor light sources that emit light in a narrow band of wavelengths which can be centered in the ultraviolet to the far infrared. Typically, the emission band is a few $k_B T$ wide, where $k_B$ is the Boltzman constant and T the temperature of the LED, and is centered at a photon energy approximately equal the semiconductor bandgap. For example, in the mid-infrared at an emission wavelength centered at 4 μm, this corresponds to an emission bandwidth at 77K of about 0.3 μm. That is, emission may extend from about 3.85 μm to about 4.15 μm.

This present methods and apparatus can increase the emission bandwidth multiple times, potentially converting a narrow band LED into a broadband one. A broadband LED can be invaluable in many applications. For example, in infrared absorption spectroscopy of one or several complex molecules, a broadband light source is typically needed over the infrared optical fingerprint region.

It is possible that broadband LEDs can displace incandescent (e.g., blackbody) infrared light sources that are currently used in optical gas sensors, which is a very high volume market, and infrared spectrometers. Incandescent infrared sources can have good wallplug (power) efficiency in the mid-infrared for specific temperatures (~1500K), and are cheap. At hotter or lower temperatures, less light is emitted in the mid-wave infrared, and they become less efficient in the mid-infrared. Moreover, the spectrum of incandescent light sources change over time, which spoils sensor calibration, the maximum radiance is limited by the melting point of metals used, the filaments burn out after a short lifetime; and the on/off rate is low, less than 400 Hz.

Infrared LEDs have higher maximum radiance, long lifetime, stable spectrum, and high on/off rates (~1 MHz). On the downside, the efficiencies are currently low—but improving with research—and spectra of infrared LEDs can be narrow. The narrow emission spectra of the current infrared LEDs makes the infrared LEDs less suitable for many infrared absorption spectroscopy applications. However, the present methods and apparatus can increase the spectra of infrared LEDs.

FIG. 1 is a diagram (stack diagram) illustrating an example device 100 in accordance with the present methods and systems. The device 100 can comprise light emitting diode, such as a broadband light emitting diode. The device 100 can be configured to emit infrared radiation. For example, the device 100 can be configured to emit infrared radiation across all or a portion of the infrared spectrum and/or the mid-infrared spectrum. For example the device 100 can be configured to emit infrared radiation in a range from about 2 µm to about 30 µm. As a specific example, a device 100 can emit radiation in a range from about 3 µm to about 5 µm. The range can be tuned by changing the thickness of one or more layers of the device 100. In an example device that comprises, InAs/GaSb superlattices (e.g., tunable from 3-30 µm), the range can be tuned by changing layer thicknesses in one or more of InAs or GaSb. The wavelength range could be extended down to 2 µm by using GaInAsSb quaternary alloy. Additional devices can comprise InAs/GaInAsSb, and InAs/InAsSb/GaSb superlattices. As a further example, the device 100 can use W-quantum wells from InAs/AlSb/InGaSb (e.g., the tunnel junction used for such device may differ from the one disclosed herein, but can be one known by those of ordinary skill in the art).

As a general overview, the device 100 can comprise a substrate and contact layer, emission regions and tunnel junctions alternatively layered N−1 times, a final emission region, top contact layer, and/or the like. The tunnel junctions can comprise a reverse biased pair of diode layers compared to the forward LED bias. For example, if the bottom contact of the LED is n-biased and the top contact is p-biased, then the tunnel junction would p then n.

The device 100 can comprise a substrate 102. The substrate 102 can be configured for back emission (e.g., emission of radiation through the substrate 102). The substrate 102 can be configured allow the emitted radiation (e.g., light) to travel through the substrate. For example, the substrate 102 can be transparent. The device 100 can comprise a bottom contact layer 104. The bottom contact layer 104 can comprise doped GaSb layers.

The device 100 can comprise a cascaded region 106. The cascaded region can comprise one or more tunnel junctions 108. The cascaded region 106 can comprise one or more emission regions 110. The cascaded region 106 can comprise a plurality of cascaded sections. One or more (or each) of the cascaded sections can comprise one of the tunnel junctions 108 and one of the emissions regions 110. The number of the cascaded sections can be based on design specifications. For example, the number of cascaded sections can be based on a predefined emission spectrum range. Emission wavelengths can be chosen to suit the application. If the user wants a continuous spectrum, the user should select the wavelength emission range, and then take sufficiently small tuning steps from one emission region to the next that a continuous spectrum results. In the examples her, 0.2 µm steps are shown (e.g., 3.3 µm, 3.5 µm, 3.71 µm, 3.9 µm, 4.1 µm, 4.4 µm, 4.71 µm, and 5.0 µm), which resulted in a continuous emission spectrum at high drive current. The detuning step size may be larger or smaller depending on wavelength range and drive current. In general, the emission width of a single emission region is relatively constant in energy (width $\Delta E \sim$ a few $k_B T$, and independent of photon energy E), but varies with center wavelength ($\Delta \lambda = (\Delta E/hc) \lambda^2$). This will be known by someone skilled in the art. The emission spectrum need not be continuous, but could a discrete set of wavelength ranges in infrared wavelengths between about 2 and about 30 µm.

Emission regions can comprise InAs/GaSb superlattices matched to GaSb with variable thickness InSb interfaces. InAs layer thicknesses can vary from about 9.7 to about 6 monolayers. GaSb can have a thickness fixed at 16 monolayers.

The tunnel junctions can be configured (e.g. as a gate) to allow electrons (e.g., and holes) to pass through to an adjacent emission region. The tunnel junctions can be configured to allow electrons (e.g., and holes) to pass through to an adjacent emission region after (e.g., in response to) radiative recombination (e.g., of a hole with an electron) in the previous emission region. As a further explanation, a standard single stage LED (e.g., an LED with a single emission layer) can be configured to inject an electron and hole into the LED from the cathode and anode, respectively. The electron and hole can meet in the emission region and recombine to produce a photon at the characteristic bandgap of semiconductor emission region. In the cascading configuration of the present device 100, multiple emission regions can be stacked one upon the other separated by tunnel junctions, as shown schematically in FIG. 1. Accordingly, the tunnel junctions can act as gates that allow electrons (e.g., or holes) to pass through to the next emission region only after they have recombined radiatively in the previous emission region. As an example, a tunnel junctions can comprise p-GaSb/n-Al$_{0.20}$In$_{0.80}$As$_{0.73}$Sb$_{0.23}$.

Figure 2:
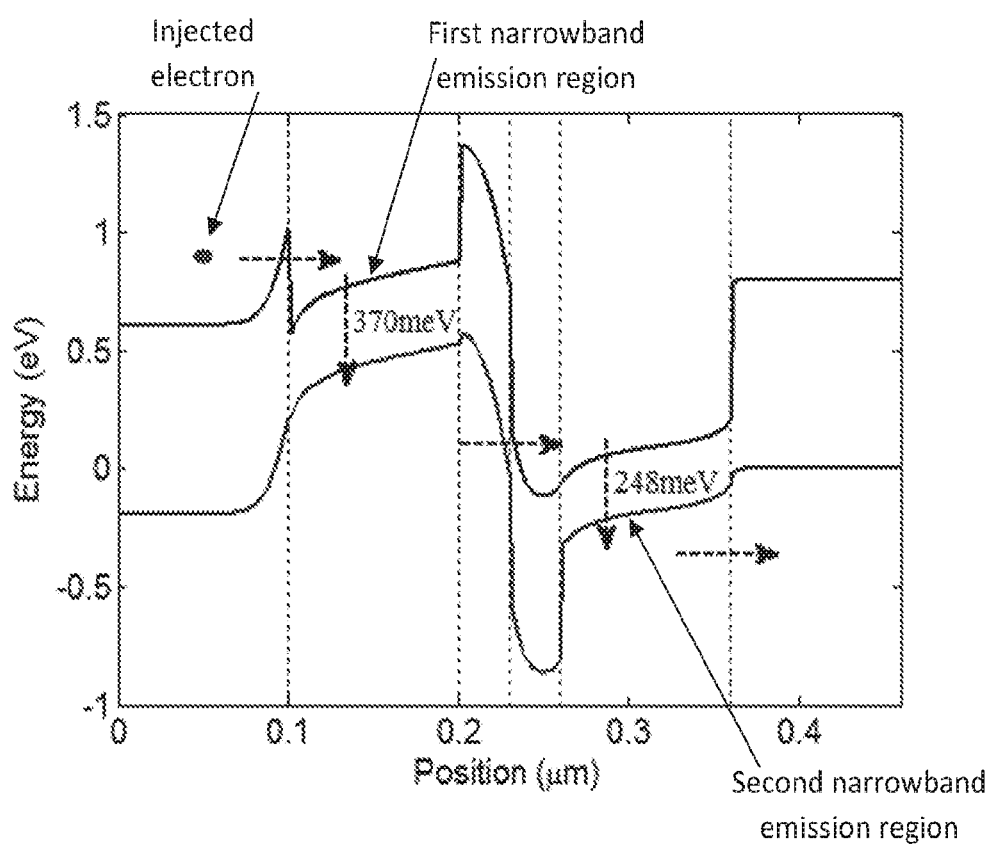
FIG. 2 illustrates a real space band structure schematic of a two-stage cascaded LED separated by a tunnel junction.

The way a tunnel junction works as a gate is shown schematically in FIG. 2, which is a real space bandstructure schematic of a two-stage cascaded LED separated by a tunnel junction. An electron is injected into the biased LED at left (red dot). The electron flows to the first narrowband emission region, where the electron emits a photon corresponding the emission region bandgap. The electron then tunnels through the tunnel junction layers into a second emission region with a slightly different bandgap, and emits a second photon with slightly different energy. By tuning the bandgap in each emission region, broadband emission can be achieved.

In an aspect, the stacked emission regions can have different bandgaps. By making the bandgap slightly different each stage, the photon emitted by each stage will have slightly different energy, and the total emission by the cascaded structure will be broadened up to N times for N stages. For a back-emitting geometry, such as in FIG. 1, where the light is emitted through the substrate, the bandgap of each emission region can decrease the further the emission region is from the substrate. This configuration can prevent the emitted light from one emission region from being absorbed by another emission region on as the emitted late is traveling (e.g., through one or more emission regions) to the emission surface. The substrate for back emission can be transparent to allow the emitted light to travel through the substrate.

In an aspect, the emission regions can be tunable in bandgap. The emission regions can be tunable without substantially changing the crystal lattice constant in order to prevent plastic relaxation of the crystal. In the infrared range, this is possible with InAs/GaSb superlattices over the emission range 3-30 µm. If GaInAsSb alloys are included, the tunable range can be increased down to about 2 µm.

The tunnel junctions for the materials can be chosen to be wider gap than the emission regions to provide blocking layers to prevent electron/hole leakage between the emission regions prior to radiative recombination. For InAs/GaSb or GaInAsSb, this can be achieved for example by using p-GaSb/n-Al$_{0.20}$In$_{0.80}$As$_{0.73}$Sb$_{0.23}$, which have 77K bandgaps of 0.8 eV/0.75 eV (cut-off wavelengths 1.55 µm/1.65 µm). In general, the tunnel junctions should have wider bandgaps than the emission layers on either side to function optimally. The tunnel junction can comprise a n+ doped layer and a p+ doped layer. The n+ doped layer can be configured to block hole leakage in the valence band of an adjacent emission region. and the p+ doped layer can be configured to block electron leakage in the conduction band of an adjacent emission region. The leakage barrier is best achieved with a wider bandgap semiconductor.

The device 100 can comprise a final emission region 112. The final emission region can have the same properties as the one or more emission regions. The device 100 can comprise a top contact layer 114. The top contact layer can be disposed above (e.g., directly on top of) the final emission region 112. The top contact layer 114 can comprise doped GaSb layers.

The present device represents an improvement over other devices. The present device improves over devices that have only a small wavelength range and are unable to transmit infrared radiation. For example, some devices may be tunable only over a very small wavelength range when used in a cascaded device. Even though a wide tuning range is in principle possible with some materials, in practice (e.g., with a ternary alloy), the lattice constant of the crystal changes with the emission wavelength. Thus, if attempts are made to tune the wavelength much, the crystal will not be lattice matched to its (virtual or non-virtual) substrate, and it will relax with misfit dislocations. The present device does not have such drawbacks. Additionally, the present device does not rely on phosphor encapsulants. In contrast, the materials disclosed herein allows tuning of the emission wavelength over a wide range (2-30 µm) without changing the superlattice (or quaternary alloy) lattice constant. Superlattices such as InAs/GaSb, InAs/InAsSb/GaSb, and InAs/GaInAsSb have tunable wavelength from 3-30 µm while maintaining the same 6.1 Å lattice constant. GaInAsSb allows additional coverage from 2-3 µm while maintaining the same 6.1 Å lattice constant. Due to the ability to vary the superlattice emission wavelength (e.g., bandgap=hc/wavelength) while keeping the lattice constant (e.g., averaged over a period) unchanged, broadband emission can be achieved in a cascaded structure from 2-30 µm with the desired spectral uniformity or multispectral characteristics simply by using enough tuned emission regions separated by tunnel junctions. Due to the ability to vary the superlattice emission wavelength (e.g., bandgap=hc/wavelength) while keeping the lattice constant (averaged over a period) unchanged, the present methods and devices allow for cascading many more detuned emission regions each with a thicker emission region. This results in a much larger range of broadband emission. The presently disclosed approach allows broadband emission in a single monolithic structure without the use of phosphors. Additionally, the presently disclosed approach improves over other devices by allowing broadband emission in the infrared spectrum.

Figure 3:
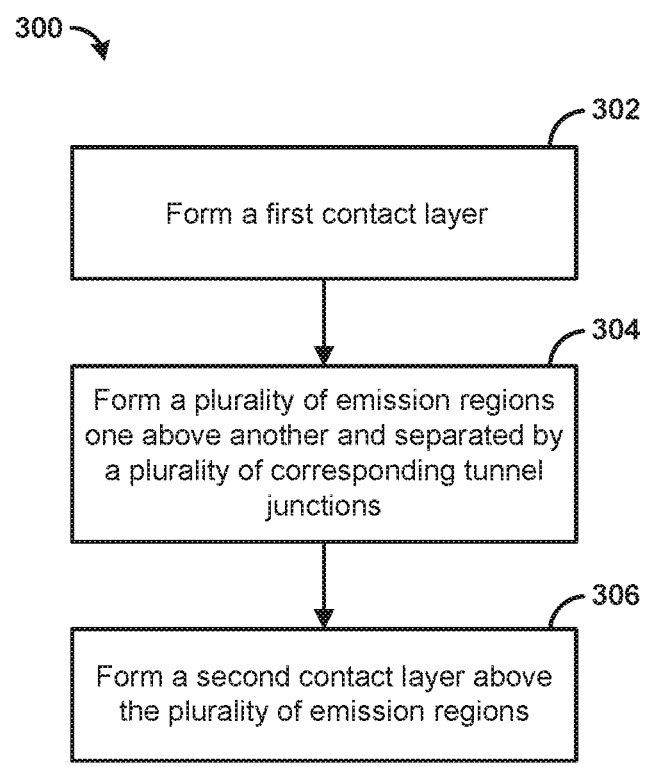
FIG. 3 is a flowchart illustrating an example method for fabricating a device in accordance with the present disclosure.

FIG. 3 is a flowchart illustrating an example method for fabricating a device in accordance with the present disclosure. At step 302, a first contact layer can be formed (e.g., on a substrate). The first contact layer can be electrically coupled to a first electrode.

At step 304, a plurality of emission regions can be formed. The plurality of emission regions can be disposed one above another. The plurality of emission regions can be separated by a plurality of corresponding tunnel junctions. One or more (or each) of the plurality of emission regions can be configured with different respective band gaps to emit radiation of different wavelengths. Each of the plurality of emission regions can be configured to emit electromagnetic radiation within the infrared spectrum.

The plurality of emission regions can comprise superlattices of a first semiconductor and a second semiconductor. The first semiconductor can comprise InAs. The second semiconductor comprise GaSb. A thickness of the first semiconductor can vary among the plurality of emission regions. A thickness of the second semiconductor can be uniform among the plurality of emission regions.

A respective band gap of each emission region of the plurality of emission regions can decrease the further the emission region is from the substrate. The respective band gaps can be incrementally different in size from a top emission region to a bottom emission region of the plurality of emission regions.

The plurality of tunnel junctions can be configured to prevent electron leakage between the plurality emission regions prior to radiative recombination. One or more of the plurality of tunnel junctions can comprise a pair of diode layers that are biased opposite to a bias of the plurality of emission regions.

At step 306, a second contact layer can be formed above the plurality of emission regions. A second electrode can be electrically coupled to the second contact layer.

Figure 4:
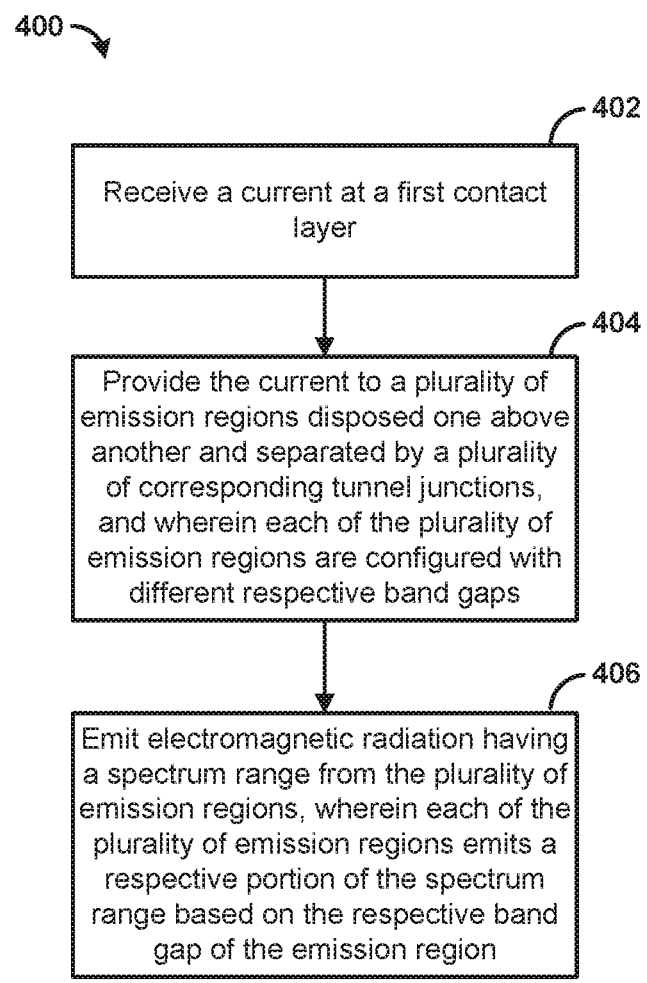
FIG. 4 is a flowchart illustrating an example method for operating a device in accordance with the present disclosure.

FIG. 4 is a flowchart illustrating an example method for operating a device in accordance with the present disclosure. At step 402, a current can be received at a first contact layer. At step 404, the current can be provided to a plurality of emission regions disposed one above another and separated by a plurality of corresponding tunnel junctions. Each of the plurality of emission regions can be configured with different respective band gaps.

At step 406, electromagnetic radiation having a spectrum range can be emitted from the plurality of emission regions. Each of the plurality of emission regions can emit a respective portion of the spectrum range based on the respective band gap of the emission region.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

The present methods and devices, are illustrated by example using InAs/GaSb cascaded superlattice light-emitting diodes (SLEDs). The example SLEDs are configured as flexible broadband infrared sources that have competitive radiance and higher modulation bandwidth than current thermal blackbody sources. These SLEDs can further be improved in radiance through employment of approaches such as light extraction and heat management strategies. The example SLEDs are not fundamentally limited by thermal degradation for achieving high radiances.

The present methods and devices improve over current infrared sources. Infrared sources are dominated by thermal emitters: most notably SiC rods (Globars) for FTIR analysis, although other sources include Nernst glowers, NiChrome resistors, and blackbody cavities. Globars are currently limited to 1650° C., with devices typically operated near 1200° C. for spectroscopy applications. LumaSense, Inc., offers a blackbody cavity that is capable of reaching 3000° C. While capable of providing adequate illumination, thermal sources are limited by Planck's law of blackbody radiation and material properties. Emissivity, phase transition, and chemical reactions limit thermal sources in atmosphere to below 2000° C. Blackbody cavities can achieve emissivities of nearly unity, and can be sheathed in noble gases, such as argon, to prevent degradation of the sources. However, even the most refractory materials are limited in peak temperature before undergoing a phase transition. Furthermore, thermal sources may take several minutes to reach a stable operating temperature, limiting spectroscopic techniques.

Solid state materials offer an alternative technology capable of overcoming the radiance and temporal limitations of thermal sources. In general, solid state sources are monochromatic, such as lasers, or narrow spectrum, such as light-emitting diodes (LEDs). Bright, broadband LED sources are useful for spectroscopy, medical, and projection applications. To create a broadband source, several LEDs or lasers can be operated in tandem. InAs/GaSb type-II SLEDs provide a promising source of bright fast infrared sources that can cascade several emission colors into a single device, creating a monolithic broadband emitter. The InAs/GaSb system can emit from 3 µm to 30 µm by varying superlattice layer thicknesses, and can suppress non-radiative Auger recombination by increasing the gap between light- and heavy-hole valence bands. Auger recombination is the dominant recombination event at high currents. Reducing Auger processes is important to creating efficient sources. Cascading emission regions further increases the efficiency of the devices by recycling the carriers in each emission region. Cascading works by coupling superlattice emission regions by tunnel junctions, in which electrons can emit a photon in each emission region. By varying emission region composition, cascaded devices are capable of emitting several different colors in a monolithic structure.

Several multicolor devices have been demonstrated, particularly in the visible spectrum. However, due to the "green-yellow" gap in efficiency, typical broadband visible diodes are comprised of a blue LED exciting red and green phosphors. Multi-wavelength devices in the infrared have been fabricated, but are primarily two-color devices. Devices based on InGaSb/AlGaAsSb and InGaAsSb/AlInGaAsSb multiple quantum wells operated at 77K were able to achieve 3.6 mW/cm$^2$-sr and 0.18 mW/cm$^2$-sr in the 1.8-2.0 µm and 2.6-3.0 µm regions, respectively. Devices based on InAs/GaInSb/InAs W-quantum wells operated at 196K demonstrated 14 mW/cm$^2$-sr in the 3-4 µm and 0.19 mW/cm$^2$-sr in the 6-9 µm spectral regions. Type-II InAs/GaSb SLEDs operated at 77K demonstrated 5.5 mW/cm$^2$-sr and 2.7 mW/cm$^2$-sr in the 3.2-4.2 µm and 4.2-5.2 µm ranges. However, all these devices were designed to exhibit independent dual-color operation. Outside of blackbody sources, broadband infrared sources are limited.

In an aspect, the following examples illustrate InAs/GaSb type-II superlattice light-emitting diodes that were fabricated to form a device that provides emission over the entire 3-5 µm mid-infrared transmission window. In a type II superlattice, the conduction and valence subbands can be staggered in both real and reciprocal space, so that electrons and holes are confined in different layers. Variable bandgap emission regions were coupled together using tunnel junctions to emit at peak wavelengths of 3.3 µm, 3.5 µm, 3.7 µm, 3.9 µm, 4.1 µm, 4.4 µm, 4.7 µm, and 5.0 µm. Cascading the emission regions can recycle the electrons in each emission region to emit several wavelengths simultaneously. At high current densities, the light-emitting diode spectra broadened into a continuous, broadband spectrum that covered the entire mid-infrared band. When cooled to 77K, radiances of over 1 W/cm$^2$-sr were achieved, demonstrating apparent temperatures above 1000K over the 3-5 µm band. InAs/GaSb type-II superlattices were configured to emit from about 3 µm to about 30 µm. The device design can be expanded to include longer emission wavelengths.

Broadband type-II InAs/GaSb superlattices designed to emit across the 3-5 µm atmospheric transmission window are demonstrated. By cascading emission regions of varying composition, broadband mid-wave emitter devices have been fabricated in a monolithic device. At low injection currents, individual peaks are discernible in the spectrum, but broaden to a continuous spectrum peaking at 3.68 µm with a full width at half-maximum of 1.4 µm, and peak radiances on 100 µm×100 µm devices of 1.04 W/cm$^2$-sr.

An example fabrication of the device is described as follows. The structures were designed to emit across the 3-5 µm atmospheric transmission window. To accomplish design specification, eight emission region stages were grown to emit at different wavelengths. The emission regions were coupled with tunnel junctions to reuse electrons in each emission region. As previously explained, a band diagram for a two-stage device is given in FIG. 2. The device can comprise a two-stage BILED device biased at XXXX V. The two emission regions in the simulation are the first and last stages of the fabricated device. Electrons are injected from the cathode (left) into the first emission region; the carrier recombines, tunnels through the junction, and recombines in the second emission region. As a further explanation, FIG. 2 illustrates the principle of an electron recombining radiatively across a 370 meV bandgap in one emission region, tunneling through the junction to the second emission region, then recombining radiatively a second time for 248 meV emission. The electron is then extracted from the valence band. The structure formed a broadband infrared LED (BILED).

Figure 5:
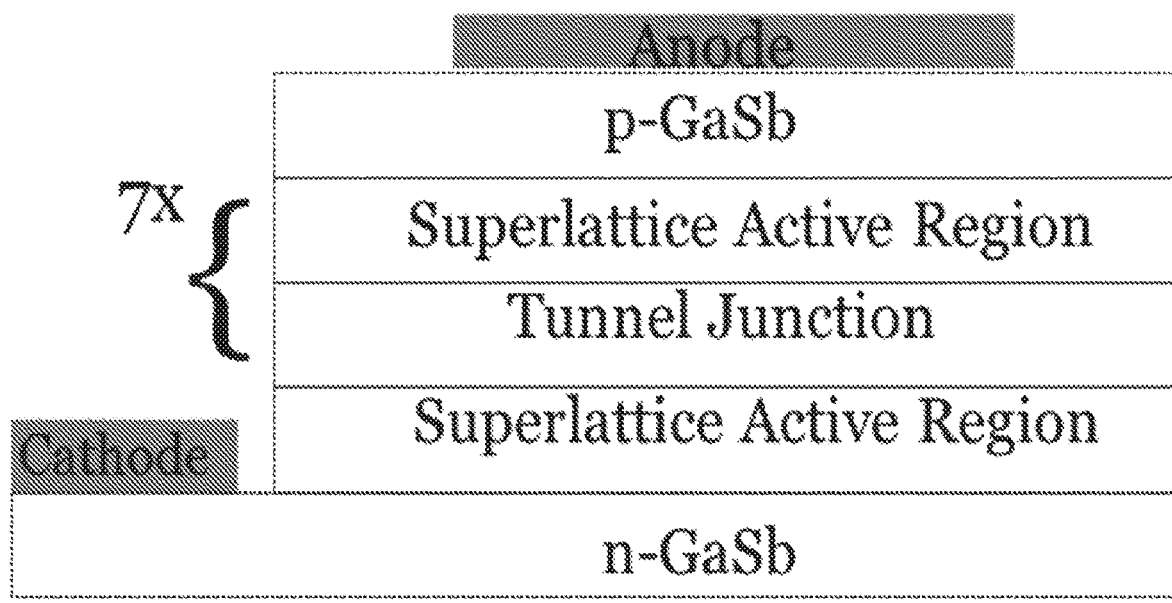
FIG. 5 is a stack diagram for a broadband SLED and a single-color SLED.

The example device was grown in a split panel Veeco Gen20 molecular beam epitaxy reactor. The molecular beam epitaxy reactor can be equipped with valved cracker cells for the V-sources and dual filament SUMO cells for the III-sources. A 1 µm-thick buffer of Te-doped (1e18 cm$^{-3}$) n-GaSb which also served as a bottom contact layer was grown on the (001) face of a GaSb wafer. The buffer was followed by eight superlattice emission regions coupled by tunnel junctions and a doped cap layer for a top contact. The superlattice emission regions, listed in Table 1, comprise twenty periods each, separated by tunnel junctions of n-AlInAsSb/p-GaSb. FIG. 5 is a stack diagram for the SLEDs. The SLEDs can comprise a broadband SLED and a single-color SLED. The BILED emission regions varied in composition. The single-color SLED was identical to stage 5 of the BILEDs in every emission region.

The n-AlInAsSb was grown digitally to prevent phase separation. The superlattice and tunnel junction are typically grown by molecular beam epitaxy between 420 and 450 C with true V/III ratios around 1.3-2. Lattice matching of the InAs/GaSb superlattices to GaSb substrates is achieved by the insertion of InSb interfaces. The AlInAsSb is a digitally grown alloy, and lattice matched to the (e.g., virtual or non-virtual) substrate. To achieve the target alloy, the As and Sb fluxes are set to achieve the desired concentration, while the In and Al shutters can be alternated in thin layers to achieve the correct concentration (e.g., but not so thick as to cause relaxation). At this time, these materials are typically grown by MBE, though the materials could be grown by MOCVD. MOCVD would have very different optimal growth conditions.

And Following the eighth superlattice, a 140 nm p-GaSb layer doped (Be) to 5e18 cm$^{-3}$ was grown. To pattern the devices, standard photolithography and wet etching was used to form square mesas with variable sizes. A mixture of citric acid, phosphoric acid, and hydrogen peroxide provided an anisotropic 45° etch in the structure, forming angled sidewalls on the diode mesas. Contacts of Ti/Pt/Au were electron-beam evaporated for both anode and cathode, on top of which a layer of indium was deposited for bonding. An 8-stage single-color device was also grown for comparison. This was identical in growth to the BILED structure, except every stage was fabricated to emit light around 4.1 µm.

Table I illustrates details of each emission region in the example BILED device. The layers are evenly spaced in energy to span the mid-wave infrared 3-5 µm transmission window.

| Stage | InAs/GaSb Composition | Target Emission | No. Periods |
|---|---|---|---|
| 1 | 6/16 | 370 meV/3.3 µm | 22 |
| 2 | 6.4/16 | 353 meV/3.5 µm | 22 |
| 3 | 6.8/16 | 335 meV/3.7 µm | 22 |
| 4 | 7.3/16 | 318 meV/3.9 µm | 21 |
| 5* | 7.8/16 | 301 meV/4.1 µm | 21 |
| 6 | 8.3/16 | 283 meV/4.4 µm | 20 |
| 7 | 9/16 | 266 meV/4.7 µm | 20 |
| 8 | 9.7/16 | 248 meV/5.0 µm | 19 |

*Superlattice of control 8-stage device.

The fabricated LEDs were flip-chipped to a silicon fanout header, which was wirebonded to a leadless chip carrier. This was mounted in a dewar against an aluminum mount in contact with an open flow of liquid nitrogen, with the temperature monitored by a silicon diode. Measurements were taken with a cooled mercury-cadmium-telluride detector with a cutoff at 10 µm. No efforts were made to collect light, thin the substrate, or apply an antireflective layer.

Figure 6:
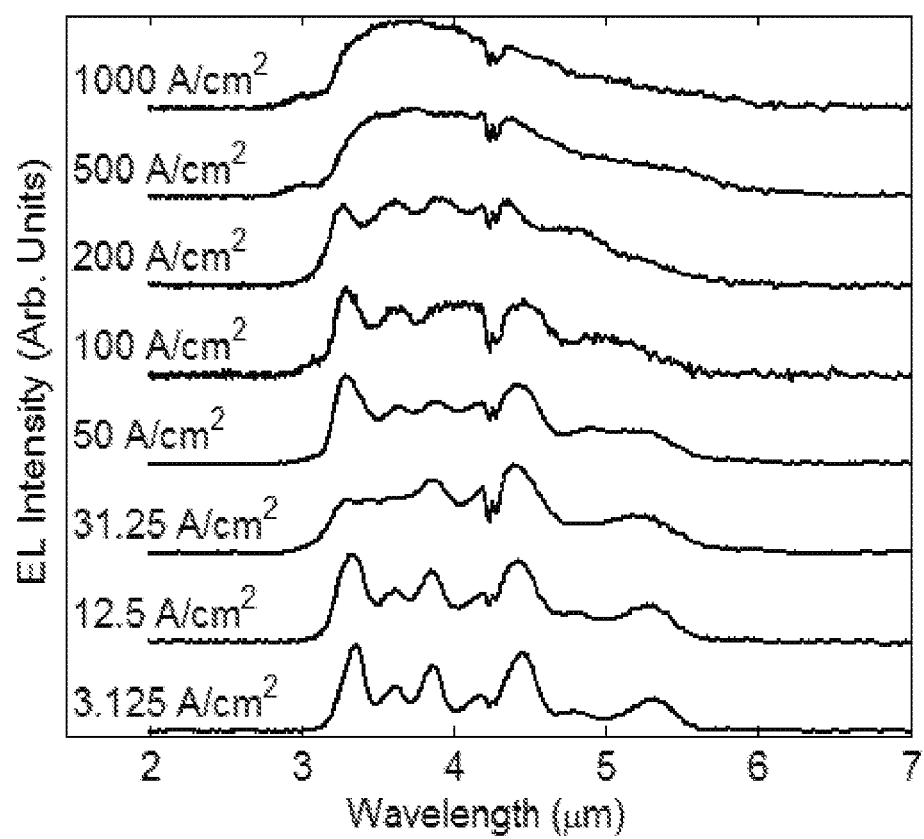
FIG. 6 illustrates Electroluminescence data taken at 77K for increasing current densities.

Using double-modulated FTIR, the output from the devices were spectrally resolved as a function of current density. FIG. 6 illustrates electroluminescence data taken at 77K for increasing current densities. The spectra demonstrate a smooth spectrum at high current densities. The spectra were measured on 400×400 µm$^2$ devices. At all current densities, the spectra span the mid-wave band from 3.2-5.5 µm. At low current densities, seven of the eight peaks are easily discernible; the peaks occur at 3.36 µm, 3.61 µm, 3.86 µm, 4.18 µm, 4.45 µm, 4.81 µm, and 5.33 µm. As the current density increases, the individual peaks broaden and overlap, forming a continuous spectrum at high current densities. The intensity of the peaks vary periodically at low current densities, with the second, fourth, and sixth peaks demonstrating a lower efficiency than the others.

Figure 7:
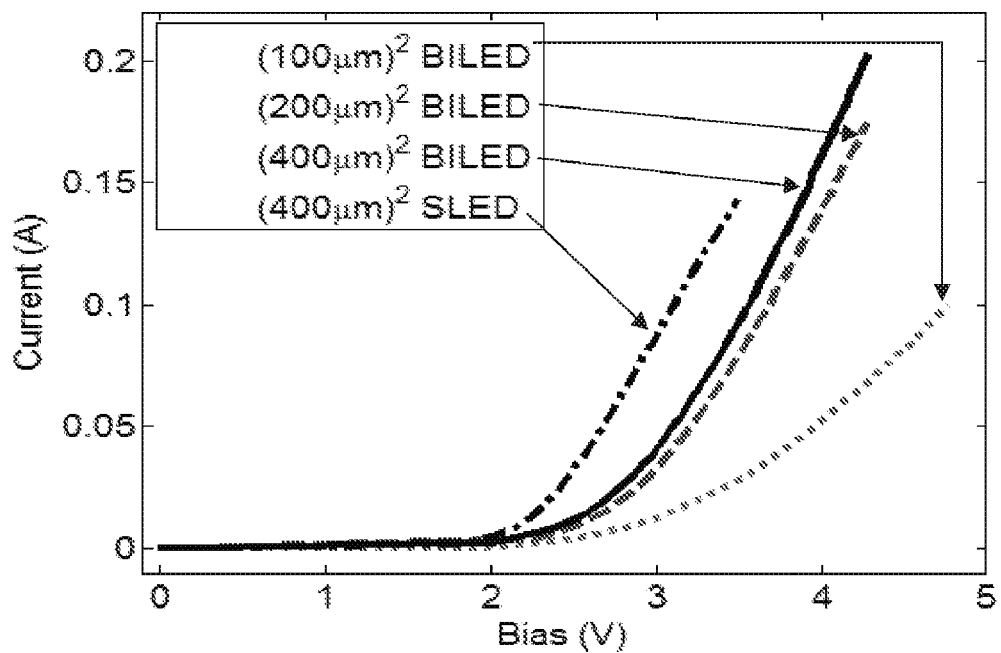
FIG. 7 illustrates current-voltage data for BILEDs mesas of varying side lengths.

The electrical response of the diodes is given in FIG. 7 for varying mesa sizes. FIG. 7 illustrates current-voltage data for BILEDs mesas of varying side lengths. Smaller mesas demonstrate higher resistances. Compared to a monochromatic SLED device peaked at 4.4 um, the turn-on voltages are slightly higher, while the series resistance is slightly lower. As a further explanation, the turn-on voltage, which is defined as the voltage at 1 mA of current, is slightly lower than the expected 2.4V for both the BILEDs and the single-color SLEDs device. Comparing series resistance in the devices by performing a linear least-squares solution to I·dV/dI=I·$R_s$+$V_{th}$, it is determined that the series resistances are 10.3Ω (100 µm×100 µm), 5.9Ω (200 µm×200 µm), and 4.9Ω (400 µm×400 µm) in the BILEDs. In the SLEDs 400 µm×400 µm control device, the series resistance was calculated to be 8.210.

Figure 8:
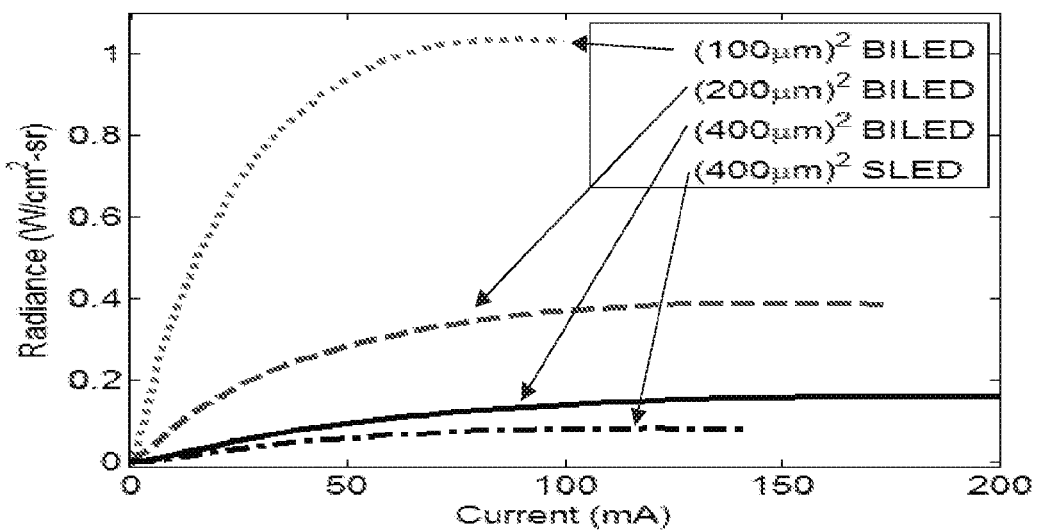
FIG. 8 presents the radiance data, given as a function of drive current.

FIG. 8 presents the radiance data, given as a function of drive current. Light-current data for BILEDs mesas of varying side lengths is illustrated. As mesas decrease in size, radiance increases. This is likely due to sidewalls redirecting light forward. This data was obtained by inputting a quasi-continuous square current pulse (50% duty cycle, 1 kHz repetition rate). As is typical with mesa diodes, smaller mesas are shown to be much more efficient, likely due to their angled sidewalls, and their greater fractional ohmic power loss at the much higher currents the run at ($I^2R_s$/IV=I$R_s$/V). The max radiance for the 100 µm×100 µm, 200 µm×200 µm, and 400 µm×400 µm BILEDs, and the 400 µm×400 µm SLEDs, are, respectively, 1.04, 0.39, 0.16, and 0.08 W/cm$^2$-sr. This computes to upper hemispheric powers of 0.33, 0.49, 0.80, and 0.41 mW.

The results above are discussed in further detail as follows. While not the brightest mid-wave infrared devices demonstrated (highest reported radiance), the example device demonstrates broadband output (1.04 W/cm$^2$) while producing a peak spectral radiance similar to comparable single color eight stage devices. Comprised of only eight stages, this device could be cascaded to include more emission regions, increasing radiance.

As current density is raised, the peaks broaden and blueshift, as shown in FIG. 6 due to increasing carrier density and the Burstein-Moss shift. At higher currents densities, the broadened peaks all blend together into a continuous curve. There is evidence of peaks redshifting at the highest current densities. This is likely due to diode heating and the dependence of the bandgap on temperature. Diode heating is also evidenced in the rollover in the radiance as seen in FIG. 8. Rollover at high injection power due to heating is a regular feature of SLEDs due to low wallplug efficiencies (<1% to date). The onset of red shifting at 500 Å/cm$^2$ in FIG. 6 coincides with the rollover in output power in FIG. 8.

Figure 9:
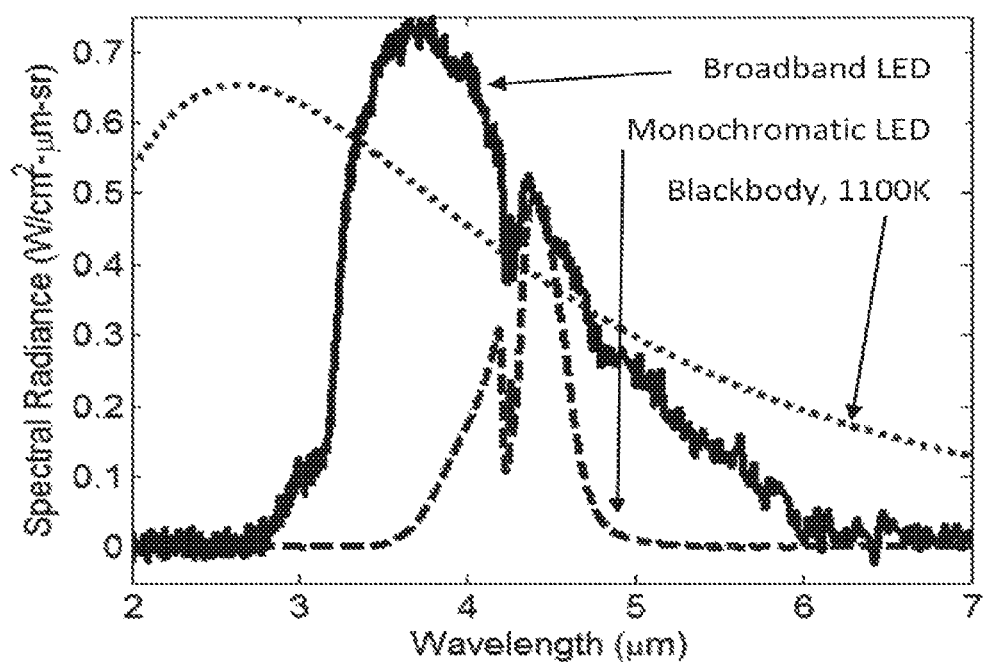
FIG. 9 illustrates electroluminescence data from the BILED device compared to the monochromatic SLED and a blackbody.

FIG. 9 shows a comparison electroluminescence spectrum between a cascaded broadband, a single band LED operating at 77K, and a blackbody at 1100K. The broadband LED is about three times broader than the single band LED. The broadband LED increases the bandgap in steps from 248 meV to 370 meV (5 µm to 3.35 µm) over eight stages, while the single band LED uses the same bandgap over all eight stages. The broadened spectrum at high current densities, peaking at 3.7 µm, is reminiscent of a blackbody spectrum. FIG. 9 emphasizes this feature: the peak radiance of the 100 µm×100 µm BILED was 1.04 W/cm$^2$-sr, comparable to a blackbody of 1100K across the range of the BILED. For comparison, the electroluminescent spectrum from the monochromatic SLED device is provided, scaled as a single stage device to fit below the BILED spectrum. The BILED output spectrum could be reshaped to a more square output dependence on wavelength, as might be desired in spectroscopy applications, by cascading additional stages at the longer wavelengths to multiply the emission there. The wavelength range of the emitters could also be extended into the long-wave infrared. The device can be made using high-power LWIR SLED emitters (e.g., reaching 0.17 mW upper hemispheric powers for 120 µm×120 µm 16-stage devices). BILEDs can be configured as infrared sources that cover the infrared band and have higher radiance than a blackbody of equal size. As thermal blackbodies increase in temperature, the blackbodies have diminishing returns in infrared radiance, as most of the light goes to shorter wavelengths.

The spectral output exhibits several interesting experimental features. The first is the alternating efficiencies in the stages at low current densities. Additionally, one emission peak appears to be missing: only seven peaks appear in the spectrum, even though there are eight distinct emission regions. Fourteen-band k·p calculations, which factor in radiative and Auger recombination coefficients, indicate that the internal quantum efficiency for these structures is relatively constant compared to the fluctuations exhibited in the low current density electroluminescent data (e.g., lower spectra in FIG. 6). Alternatively, small shifts in the band offsets or superlattice composition could affect the Shockley-Read-Hall recombination rate in each stage, or the relative thickness of the tunnel junction. Uneven distribution of charges across the eight cascaded stages due to stage-to-stage variations could also lead to variations in output per stage, because radiative efficiency and total output are dependent on the carrier density. Besides providing an avenue for broadened output, variation in stage bandgap also suggests a method to experimentally probe the relative efficiency and functionality of each stage in the cascaded structure.

In conclusion, broadband type-II InAs/GaSb superlattice light-emitting diodes were demonstrated across the mid-wave infrared band. At half-max, the spectrum spans 3.24 µm-4.68 µm, achieving radiances of up to 1.04 W/cm$^2$-sr and an apparent temperature of 1100K across the 3-5 µm band. At low current densities, periodic variations in the relative efficiency were revealed, suggesting a method to probe individual emission regions in cascaded devices. By cascading superlattices designed to emit anywhere from 3-30 µm, the mid-wave, long-wave, and very-long-wave infrared regions can be represented in a BILEDs device. By varying the number of single-color emission regions, the output spectrum has the ability to be tailored to over-represent longer wavelengths, providing a brighter mid-wave to long-wave source than is possible in thermal materials.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A device, comprising: a bottom contact layer:
    a plurality of emission regions above the bottom contact layer, wherein the plurality of emission regions are disposed one above another, and wherein each of the plurality of emission regions are configured with different respective band gaps to emit radiation of different wavelengths;
    a plurality of tunnel junctions, wherein each of the tunnel junctions is disposed between at least two corresponding emission regions of the plurality of emission regions: and
    a top contact layer above the plurality of emission regions, wherein a thickness of a first semiconductor varies among the plurality of emission regions and a thickness of a second semiconductor is uniform among the plurality of emission regions.

2. The device of claim 1, wherein the plurality of tunnel junctions are configured to prevent electron leakage between the plurality of emission regions prior to radiative recombination.

3. The device of claim 1, wherein one or more of the plurality of tunnel junctions comprise a pair of diode layers that are biased opposite to a bias of the plurality of emission regions.

4. A method of fabrication comprising: forming a first contact layer;
    forming a plurality of emission regions disposed one above another and separated by a plurality of corresponding tunnel junctions, and wherein each of the plurality of emission regions are configured with different respective band gaps to emit radiation of different wavelengths; and
    forming a second contact layer above the plurality of emission regions
    wherein a thickness of a first semiconductor varies among the plurality of emission regions and a thickness of a second semiconductor is uniform among the plurality of emission regions.

5. The method of claim 4, wherein the plurality of tunnel junctions are configured to prevent electron leakage between the plurality emission regions prior to radiative recombination.

6. The method of claim 4, wherein one or more of the plurality of tunnel junctions comprise a pair of diode layers that are biased opposite to a bias of the plurality of emission regions.

7. The device of claim 1, wherein each of the plurality of emission regions is configured to emit electromagnetic radiation within the infrared spectrum.

8. The device of claim 1, wherein a respective band gap of each emission region of the plurality of emission regions decreases the further the emission region is from a substrate.

9. The device of claim 8, wherein the respective band gaps are incrementally different in size from a top emission region to a bottom emission region of the plurality of emission regions.

10. The device of claim 1, wherein the plurality of emission regions comprise superlattices of a first semiconductor and a second semiconductor.

11. The device of claim 10, wherein the first semiconductor comprises InAs and the second semiconductor comprises GaSb.

12. The method of claim 4, wherein each of the plurality of emission regions is configured to emit electromagnetic radiation within the infrared spectrum.

13. The method of claim 4, wherein a respective band gap of each emission region of the plurality of emission regions decreases the further the emission region is from a substrate.

14. The method of claim 13, wherein the respective band gaps are incrementally different in size from a top emission region to a bottom emission region of the plurality of emission regions.

15. The method of claim 4, wherein the plurality of emission regions comprise superlattices of a first semiconductor and a second semiconductor.

16. The method of claim 15, wherein the first semiconductor comprises InAs and the second semiconductor comprises GaSb.

* * * * *